United States Patent
Subramanian

(10) Patent No.: US 6,727,199 B2
(45) Date of Patent: Apr. 27, 2004

(54) SODIUM COPPER TITANATE COMPOSITIONS CONTAINING A RARE EARTH, YTTRIUM OR BISMUTH

(75) Inventor: Munirpallam A. Subramanian, Kennett Square, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/262,782

(22) Filed: Oct. 2, 2002

(65) Prior Publication Data

US 2003/0104924 A1 Jun. 5, 2003

Related U.S. Application Data

(60) Provisional application No. 60/328,758, filed on Oct. 12, 2001.

(51) Int. Cl.$^7$ .................... C04B 35/462; C04B 35/50
(52) U.S. Cl. .................... 501/134; 501/152; 361/321.5
(58) Field of Search .................. 501/134, 152; 361/321.5

(56) References Cited

PUBLICATIONS

International Search Report dated Aug. 12, 2003.
M.A. Subramanian, et al. "High Dielectric Constant in ACu3Ti4O12 and ACu3Ti3FeO12 Phases", Journal of Solid State Chemistry, (2000), vol. 151, pp. 323–325, Maryland, No Month.
A.P. Ramnirez, et al., "Giant dielectric constant response in a copper–titanate", Solid State Communications, (2000), vol. 115, pp. 217–220, New York, No Month.

*Primary Examiner*—Karl Group

(57) ABSTRACT

This invention provides compositions of the formula $Na_{0.5}M_{0.5}Cu_3Ti_4O_{12}$ wherein M=La—Lu, Y, Bi or mixtures thereof. These compositions have high dielectric constant and low loss over a frequency range of from about 1 kHz to about 1 MHz.

22 Claims, 1 Drawing Sheet

Variation of Dielectric Constant versus Frequency for
$Na_{0.5}M_{0.5}Cu_3Ti_4O_{12}$

SODIUM COPPER TITANATE COMPOSITIONS CONTAINING A RARE EARTH, YTTRIUM OR BISMUTH

This application claims the benefit of U.S. Provisional Application No. 60/328,758, filed on Oct. 12, 2001.

FIELD OF THE INVENTION

This invention relates to novel compositions of the formula $Na_{0.5}M_{0.5}Cu_3Ti_4O_{12}$ wherein M is La—Lu, Y, Bi or mixtures thereof.

BACKGROUND OF THE INVENTION

The use of dielectric materials to increase capacitance is well known and long-used. Known capacitor dielectrics fall into two categories. One category of dielectrics has a relatively temperature-independent dielectric constant but the value of the dielectric constant is low, e.g. 5–10. Materials such as electrical porcelain and mica fall into this category. Another category of dielectrics has a very high dielectric constant, e.g. 1000 or more, but they are quite frequency dependent. An example is barium titanate ($BaTiO_3$).

Since the capacitance is proportional to the dielectric constant, high dielectric constant materials are desired. In order to perform acceptably in electronic circuits, the dielectric must have a dielectric constant that exhibits minimal frequency dependence. It is also desirable to have the loss or dissipation factor as small as possible. The materials of this invention meets those needs.

SUMMARY OF THE INVENTION

This invention provides compositions of the formula $Na_{0.5}M_{0.5}Cu_3Ti_4O_{12}$ wherein M is La—Lu, Y, Bi or mixtures thereof. These compositions have high dielectric constant and low loss over a frequency range of from 1 kHz to 1 MHz and are especially useful in capacitors in electronic devices such as phase shifters, matching networks, oscillators, filters, resonators, and antennas comprising interdigital and trilayer capacitors, coplanar waveguides and microstrips.

DETAILED DESCRIPTION OF THE INVENTION

Figure 1:
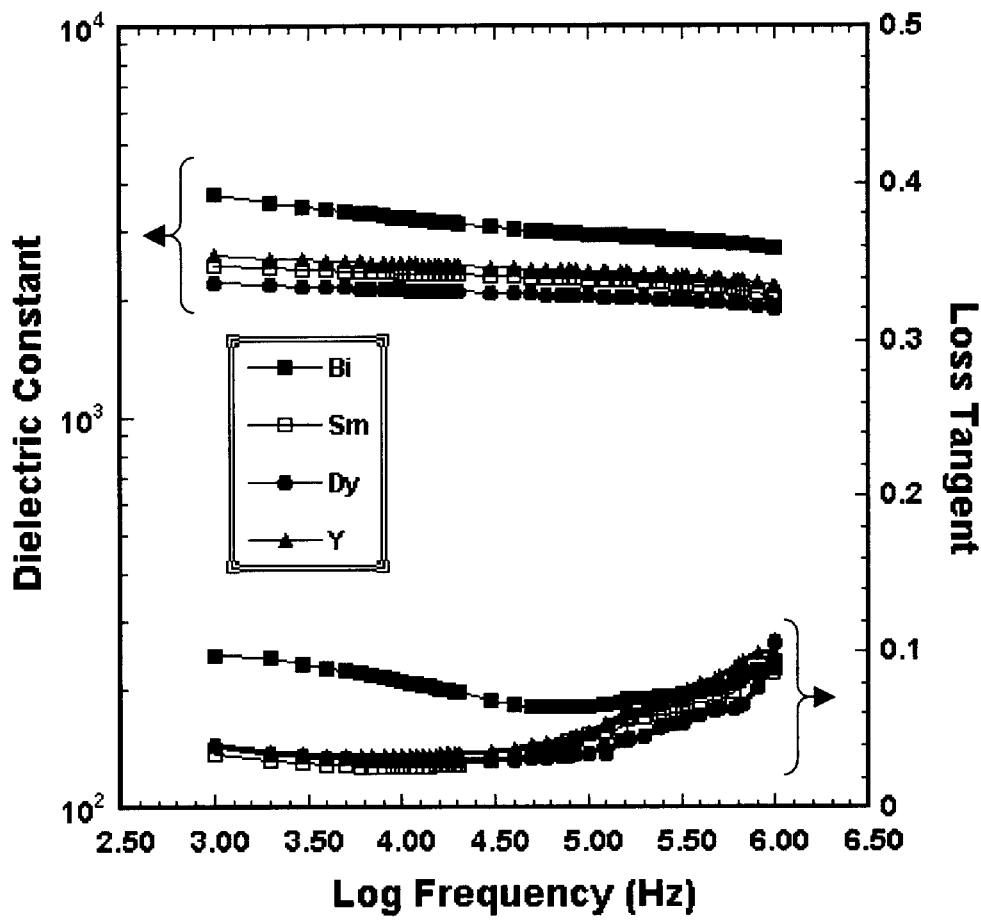
FIG. 1 shows the variation of dielectric constant and loss factor for the compositions of Examples 2, 4, 6 and 7.

The compositions of this invention, $Na_{0.5}M_{0.5}Cu_3Ti_4O_{12}$, wherein M is La—Lu, Y, Bi or mixtures thereof, have dielectric properties that provide advantages in electronic devices requiring a high dielectric constant with minimal frequency dependence and low loss. "La—Lu" is defined as all the lanthanide (rare earth) elements with atomic numbers from 57 through 71.

The compositions of this invention can be synthesized by the following procedure. Stoichiometric amounts of the starting materials are thoroughly mixed. The starting materials $M_2O_3$ (M is La—Lu, Y, Bi or mixtures thereof), CuO, $TiO_2$ and $Na_2CO_3$ are preferred. The mixed powder of starting materials is calcined at about 900° C. for about 12 hours. The calcined powder is reground and pressed to about 12.7 mm diameter/1–2 mm thick disks. The disks are sintered in air at about 950° C. for 24 hours. In both the calcining and sintering steps, the rate of temperature increase is about 200° C./hour from room temperature (i.e. about 20–25° C.) to the calcining or sintering temperature. The rate of temperature decrease is about 150° C./hour from the calcining or sintering temperature to room temperature.

All of the $Na_{0.5}M_{0.5}Cu_3Ti_4O_{12}$ phases of this invention crystallize in a cubic perovskite-related Im3 structure.

Dielectric measurements can be carried out on the disk samples. The faces of the disk-shaped samples are polished with a fine-grit sand or emery paper. Silver paint electrodes are applied on the faces and dried at about 70–100° C. The capacitance and the dielectric loss measurements can be performed by the two-terminal method using Hewlett-Packard 4275A and 4284A LCR bridges at a temperature of about 25° C. over a frequency range of from about 1 kHz to about 1 MHz. The capacitance (C) and the dissipation factor are read directly from the bridge. The dielectric constant (K) is calculated from the measured capacitance (C) in picofarads from the relationship $K=(100*C*t)/(8.854*A)$, where t is thickness of the disk shaped sample in cm, A is the area of the electrode in $cm^2$, and * indicates multiplication The advantageous effects of this invention are demonstrated by a series of examples, as described below. The embodiments of the invention on which the examples are based are illustrative only, and do not limit the scope of the invention.

EXAMPLES 1–7

The compositions $Na_{0.5}M_{0.5}Cu_3Ti_4O_{12}$ of Examples 1–7 wherein M is La, Sm, Gd, Dy, Yb, Bi and Y, respectively, were made using the following procedure. For each Example, appropriate amounts of the starting oxides $Na_2CO_3$, $M_2O_3$, CuO and $TiO_2$ were weighed according to the stoichiometric ratios and mixed thoroughly in an agate mortar. The gram amounts of the starting materials used are shown in Table 1.

TABLE 1

| Ex. | Composition | $Na_2CO_3$ | $M_2O_3$ | CuO | $TiO_2$ |
|---|---|---|---|---|---|
| 1 | $Na_{0.5}La_{0.5}Cu_3Ti_4O_{12}$ | 0.0647 | 0.1989 ($La_2O_3$) | 0.5828 | 0.7803 |
| 2 | $Na_{0.5}Sm_{0.5}Cu_3Ti_4O_{12}$ | 0.0641 | 0.2110 ($Sm_2O_3$) | 0.5777 | 0.7736 |
| 3 | $Na_{0.5}Gd_{0.5}Cu_3Ti_4O_{12}$ | 0.0638 | 0.2182 ($Gd_2O_3$) | 0.5747 | 0.7696 |
| 4 | $Na_{0.5}Dy_{0.5}Cu_3Ti_4O_{12}$ | 0.0635 | 0.2237 ($Dy_2O_3$) | 0.5725 | 0.7665 |
| 5 | $Na_{0.5}Yb_{0.5}Cu_3Ti_4O_{12}$ | 0.0630 | 0.2345 ($Yb_2O_3$) | 0.5680 | 0.7605 |
| 6 | $Na_{0.5}Bi_{0.5}Cu_3Ti_4O_{12}$ | 0.0614 | 0.2700 ($Bi_2O_3$) | 0.5532 | 0.7407 |
| 7 | $Na_{0.5}Y_{0.5}Cu_3Ti_4O_{12}$ | 0.0672 | 0.1433 ($Y_2O_3$) | 0.6059 | 0.8113 |

In each Example, the mixed powder was calcined at about 900° C. for 12 hours. The calcined powder was reground and pressed to 12.7 mm diameter/1–2 mm thick disks. The disks were sintered in air at about 950° C. for 24 hours. In both the calcining and sintering steps, the temperature was increased from room temperature to the calcining or sintering temperature at a rate of about 200° C./hour, and the temperature was decreased from the calcining or sintering temperature to room temperature at a rate of about 150° C./hour.

X-ray powder diffraction patterns were recorded with a Siemens D5000 diffractometer. The data showed all samples crystallized in a cubic perovskite-related Im3 structure. The measured lattice parameters are listed in Table 2.

TABLE 2

| Ex. | Composition | Lattice Parameter (nm) | Dielectric Constant ($10^5$ Hz) @ 298 K | Dielectric Loss, tan δ ($10^5$ Hz) @ 298 K |
|---|---|---|---|---|
| 1 | $Na_{0.5}La_{0.5}Cu_3Ti_4O_{12}$ | 0.7420 (1) | 3560 | 0.074 |
| 2 | $Na_{0.5}Sm_{0.5}Cu_3Ti_4O_{12}$ | 0.7395 (1) | 2263 | 0.047 |
| 3 | $Na_{0.5}Gd_{0.5}Cu_3Ti_4O_{12}$ | 0.7388 (1) | 2645 | 0.054 |
| 4 | $Na_{0.5}Dy_{0.5}Cu_3Ti_4O_{12}$ | 0.7379 (1) | 2049 | 0.035 |
| 5 | $Na_{0.5}Yb_{0.5}Cu_3Ti_4O_{12}$ | 0.7361 (1) | 2048 | 0.059 |
| 6 | $Na_{0.5}Bi_{0.5}Cu_3Ti_4O_{12}$ | 0.7412 (1) | 2952 | 0.065 |
| 7 | $Na_{0.5}Y_{0.5}Cu_3Ti_4O_{12}$ | 0.7385 (1) | 2375 | 0.048 |

The disk samples were polished to produce flat uniform surfaces and electroded with silver paint. The painted samples were dried at about 70–100° C. overnight. Capacitance and loss tangent measurements were done at room temperature using a HP-4284A LCR meter over a frequency range of from 1 kHz to 1 MHz. Dielectric constant and loss data measured at a temperature of about 25° C. (298 K) and a frequency of about $10^5$ Hz are listed in Table 2. The dielectric constants are high and the loss factors are low. Variations of dielectric constant and loss factor over a range of frequency from about $10^3$ Hz to about $10^6$ Hz for the samples of Examples 2, 4, 6 and 7 are shown in FIG. 1. The dielectric constants and loss factors have minimal frequency dependence over 3 orders of magnitude change in frequency.

What is claimed is:

1. A composition of the formula $Na_{0.5}M_{0.5}Cu_3Ti_4O_{12}$, wherein M is La—Lu, Y, Bi or mixtures thereof.
2. A composition of the formula $Na_{0.5}M_{0.5}Cu_3Ti_4O_{12}$, wherein M is La—Lu.
3. A composition of the formula $Na_{0.5}M_{0.5}Cu_3Ti_4O_{12}$, wherein M is Y.
4. A composition of the formula $Na_{0.5}M_{0.5}Cu_3Ti_4O_{12}$, wherein M is Bi.
5. The composition of claim 1, wherein M is La, Sm, Gd, Dy, Yb, Y or Bi.
6. The composition of claim 1, wherein M is La.
7. The composition of claim 1, wherein M is Sm.
8. The composition of claim 1, wherein M is Gd.
9. The composition of claim 1, wherein M is Dy.
10. The composition of claim 1, wherein M is Yb.
11. A method of making a dielectric comprising fabrication a composition of the formula $Na_{0.5}M_{0.5}Cu_3Ti_4O_{12}$, wherein M is La—Lu, Y, Bi or mixtures thereof as the dielectric.
12. The method of claim 11 wherein M is Y or Bi.
13. An electronic device containing a capacitor with a dielectric material, wherein said dielectric material is comprised of a composition of the formula $Na_{0.5}M_{0.5}Cu_3Ti_4O_{12}$, wherein M is La—Lu, Y, Bi or mixtures thereof.
14. An electronic device containing a capacitor with a dielectric material, wherein said dielectric material is comprised of a composition of the formula $Na_{0.5}M_{0.5}Cu_3Ti_4O_{12}$, wherein M is La—Lu.
15. The electronic device of claim 13, wherein said dielectric material is comprised of a composition of the formula $Na_{0.5}M_{0.5}Cu_3Ti_4O_{12}$, wherein M is La, Sm, Gd, Dy, Yb, Y or Bi.
16. The electronic device of claim 13, wherein said dielectric material is comprised of a composition of the formula $Na_{0.5}M_{0.5}Cu_3Ti_4O_{12}$, wherein M is La.
17. The electronic device of claim 13, wherein said dielectric material is comprised of a composition of the formula $Na_{0.5}M_{0.5}Cu_3Ti_4O_{12}$, wherein M is Sm.
18. The electronic device of claim 13, wherein said dielectric material is comprised of a composition of the formula $Na_{0.5}M_{0.5}Cu_3Ti_4O_{12}$, wherein M is Gd.
19. The electronic device of claim 13, wherein said dielectric material is comprised of a composition of the formula $Na_{0.5}M_{0.5}Cu_3Ti_4O_{12}$, wherein M is Dy.
20. The electronic device of claim 13, wherein said dielectric material is comprised of a composition of the formula $Na_{0.5}M_{0.5}Cu_3Ti_4O_{12}$, wherein M is Yb.
21. The electronic device of claim 13, wherein said dielectric material is comprised of a composition of the formula $Na_{0.5}M_{0.5}Cu_3Ti_4O_{12}$, wherein M is Y.
22. The electronic device of claim 13, wherein said dielectric material is comprised of a composition of the formula $Na_{0.5}M_{0.5}Cu_3Ti_4O_{12}$, wherein M is Bi.

* * * * *